United States Patent
Kawano et al.

[11] Patent Number: 5,738,938
[45] Date of Patent: Apr. 14, 1998

[54] MAGNETOELECTRIC TRANSDUCER

[75] Inventors: Yuji Kawano; Tatsuya Fukami; Yoshinobu Maeda, all of Tokyo, Japan

[73] Assignee: Mitsubishi Denki Kabushiki Kaisha, Tokyo, Japan

[21] Appl. No.: 623,823

[22] Filed: Mar. 29, 1996

[30] Foreign Application Priority Data

Mar. 31, 1995 [JP] Japan .................................. 7-076484

[51] Int. Cl.$^6$ ...................................... G11B 5/66
[52] U.S. Cl. .................. 428/332; 428/336; 428/692; 428/694 T; 428/694 TS; 428/694 TM; 428/694 ML; 428/694 RE; 428/694 EC; 428/900; 365/158; 365/173; 360/113; 324/252; 338/32 R
[58] Field of Search ................... 428/332, 336, 428/692, 694 T, 694 TS, 694 ML, 694 TM, 694 RE, 694 EC, 900; 365/158, 173; 360/113; 324/252; 338/32 R

[56] References Cited

U.S. PATENT DOCUMENTS 5,159,513 10/1992 Dieny et al. ........................ 360/113
5,432,734 7/1995 Kawano et al. ..................... 365/158
5,549,978 8/1996 Iwasaki et al. ..................... 428/692

*Primary Examiner*—Leszek Kiliman
*Attorney, Agent, or Firm*—Burns, Doane, Swecker & Mathis, LLP

[57] ABSTRACT

A magnetoelectric transducer is proposed using the GMR effect which operates stably even in a wider range of magnetic field, and over a wider temperature range, than currently available. Upon a substrate 5 there are formed a first magnetic layer 1, a non magnetic layer 3, a second magnetic layer 2, and a rare earth—transition metal alloy layer 4. The second magnetic layer 2 and the rare earth—transition metal alloy layer undergo exchange coupling. The axes of easy magnetization of the second magnetic layer 2 and the rare earth—transition metal alloy layer 4 lie along the surfaces of these layers. The composition of the rare earth—transition metal alloy layer 4 exhibits rare earth dominance at room temperature. The main component of the non magnetic layer 3 is Cu, and the thickness of this layer 3 is at least 1.5 nm.

8 Claims, 7 Drawing Sheets 5,738,938

MAGNETOELECTRIC TRANSDUCER

BACKGROUND OF THE INVENTION

1. Field of the Invention

The present invention relates to a layered structure which exhibits the magnetoresistance effect, and to a magnetoelectric transducer incorporating the same.

2. Description of the Related Art

The phenomenon by which the specific electrical resistance of a substance changes in response to the application of an external magnetic field is called the magnetoresistance (MR) effect, and in the prior art there have been known various substances which exhibit this effect, such as semiconductors and magnetic materials.

In this connection, normal magnetic materials exhibit the anisotropic magnetoresistance (AMR) effect, by which the specific electrical resistance varies according to the square of the cosine of the angle between the direction of magnetization and the direction of current flow. Ni-Fe alloys are substances which exhibit this effect to a great extent, and which possess a relative change of electrical resistance of about 3%. In the prior art, magnetoresistance elements (MR elements) have operated on the basis of this AMR effect, but for those which can operate in a comparatively weak magnetic field the relative change of resistance is small, and there has been an unsatisfied requirement for devices which have larger relative change of resistance.

Recently, elements exhibiting an MR effect larger than the AMR effect (i.e., the so called giant magnetoresistance (GMR) effect) have been invented, which are multi layered constructions made from magnetic layers and non magnetic layers alternatingly layered together, and these have attracted much attention. This GMR effect arises due to the relative angle between the magnetizations of adjacent magnetic layers, without any relation to the direction of flow of the electrical current, and the value of the resistance varies according to the cosine of this angle. Accordingly, this effect is maximum when the mutual magnetizations are arranged to be mutually antiparallel, and is minimum when they are arranged to be mutually parallel.

Such a multilayered structure, which operates on the basis of this GMR effect, is disclosed in Japanese Patent Publication Serial No. Heisei 4-358310. This publication teaches a magnetoresistance sensor which is made up from a first magnetic layer and a second magnetic layer of a ferromagnetic material which are mutually separated by a thin layer of non magnetic metallic material, and which is characterized in that, when the applied magnetic field is zero, the directions of the magnetizations of the first thin layer and the second thin layer of ferromagnetic material are mutually perpendicular; and it is stated that, when the applied magnetic field is near zero, the change of resistance for the magnetic field has an inclination according to the rotation of the magnetization of the large coercive force material.

This MR sensor is called a spin valve MR sensor, and the magnetization of the second magnetic layer is fixed by exchange coupling with an adjacent antiferromagnetic material layer (FeMn, NiMn) or a large coercive force magnetic layer (CoPt, CoPtCr), so that it becomes relatively hard magnetically.

However, these layers which induce exchange anisotropy are made from crystalline materials, and there are the problems in production and application that the fixing force on the magnetization of the second magnetic layer is unreliable due to the substrate or a buffer layer, and moreover the blocking temperature is comparatively low, and the upper limit for the operating temperature is low.

SUMMARY OF THE INVENTION

The present invention has been made in order to resolve problems like those described above, and its objective is to provide a magnetoelectric transducer using the GMR effect which operates stably in a wider range of magnetic field, and over a wider temperature range, than currently available.

According to one aspect of the present invention, there is provided a magnetoelectric transducer comprising, formed upon a substrate, a first magnetic layer, a non magnetic layer, a second magnetic layer, and a rare earth—transition metal alloy layer; the second magnetic layer and the rare earth—transition metal alloy layer undergoing exchange coupling; the second magnetic layer and the rare earth—transition metal alloy layer having axes of easy magnetization lying along the surfaces of these layers; and the rare earth—transition metal alloy layer having a composition exhibiting rare earth dominance at room temperature.

Thereby, due to large magnetic anisotropy of the rare earth—transition metal alloy layer, and because the second magnetic layer is provided adjacent to the rare earth—transition metal alloy layer, the beneficial effect is produced that this magnetoelectric transducer operates with wide stability as compared to prior art elements, even in a wider range of magnetic field and over a wider temperature range. Thus, improvement of the stability of the magnetoelectric transducer in the high temperature region can be relied upon.

In a preferred form of the invention, the non magnetic layer has a main component of Cu.

In another preferred form of the invention, the non magnetic layer has a thickness of at least 1.5 nm.

In a further preferred form of the invention, the rare earth—transition metal alloy layer comprises a rare earth main component of Tb, and transition metal main components of Co and Fe.

In a further preferred form of the invention, the rare earth—transition metal alloy layer comprises $TbCo_xFe_{100-x}$, with $x \geq 50$ (atomic percent). Thus, the switching field of the magnetization of the second magnetic layer at a high temperature such as, for example, 100° C. is large, which is desirable.

In a further preferred form of the invention, the magnetoelectric transducer further comprises a third magnetic layer provided adjacent to the rare earth—transition metal alloy layer. Accordingly, along with being able to make the magnetic anisotropy along the surfaces of the layers greater, the freedom in selection of the composition and the thickness of the rare earth—transition metal alloy layer is increased, and the designing of the switching field of the magnetization of the second magnetic layer can be easily performed.

In a further preferred form of the invention, the first magnetic layer and the second magnetic layer have axes of easy magnetization which are mutually perpendicular.

In a further preferred form of the invention, the first magnetic layer is induced magnetic anisotropy while it is being formed, while the second magnetic layer and the rare earth—transition metal alloy layer are induced magnetic anisotropy by heat treatment in a magnetic field after they have been formed. Thus, it is possible effectively to induce the magnetic anisotropy by heat treatment in a magnetic field.

In a further preferred form of the invention, the intensity of the magnetic field applied in the perpendicular direction to the axis of easy magnetization of the first magnetic layer is detected. Thereby, since the electrical resistance change which arises from the rotation of the magnetization of the first magnetic layer due to the magnetic field component perpendicular to the axis of easy magnetization of the first magnetic layer is detected as a function of a detected magnetic field, a magnetoelectric transducer, as a linear sensor, is obtained whose linearity is excellent.

Further, the beneficial effect is produced that it is possible to provide a high quality magnetic head or magnetic field sensor or the like which operates stably over an extremely wide range of magnetic field, and over a wide temperature range.

DESCRIPTION OF THE PREFERRED EMBODIMENTS

Preferred embodiments of the present invention will be described below in detail while referring to the accompanying drawings.

EMBODIMENT 1

Figure 1:
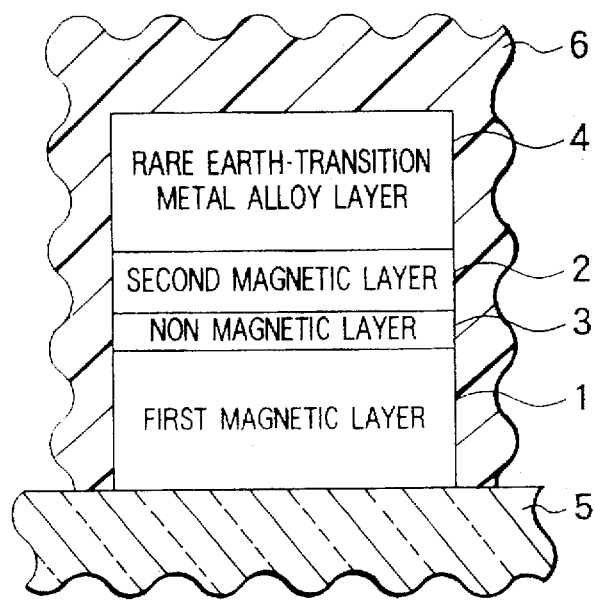
FIG. 1 is a sectional figure showing the spin valve layer of a preferred embodiment of the magnetoelectric transducer of the present invention.

FIG. 1 is a cross sectional view showing a magnetoelectric transducer which is the first preferred embodiment of the present invention. This magnetoelectric transducer, as shown in the figure, is formed upon a substrate 5 of glass, and is a layered structure comprising in order: a first thin magnetic layer 1 formed of $Ni_{80}Fe_{20}$ and having a thickness of 7.0 nm; a non magnetic layer 3 formed of Cu and having a thickness of 2.0 nm; a second thin magnetic layer 2 formed of Co and having a thickness 3.0 nm; and a rare earth—transition metal alloy layer 4 formed of $Tb_{28}Co_{72}$ having a thickness of 7.0 nm. Over the top of these a protective layer 6 is provided which is formed of SiN and the like and has a thickness of about 100 nm.

Further, the first magnetic layer 1, the second magnetic layer 2, and the rare earth—transition metal alloy layer 4 have the magnetic anisotropy. The first magnetic layer 1 is induced the magnetic anisotropy by being formed in a magnetic field; while the second magnetic layer 2 and the rare earth—transition metal alloy layer 4 are induced the magnetic anisotropy by heat treatment in a magnetic field after they have been formed. The magnetization of the second magnetic layer 2 functions by exchange coupling in the same manner as the magnetization of the rare earth—transition metal alloy layer 4, and its axis of easy magnetization is arranged to be parallel to that of the rare earth—transition metal alloy layer 4, and is arranged to be perpendicular to the axis of easy magnetization of the first magnetic layer 1.

Figure 2:
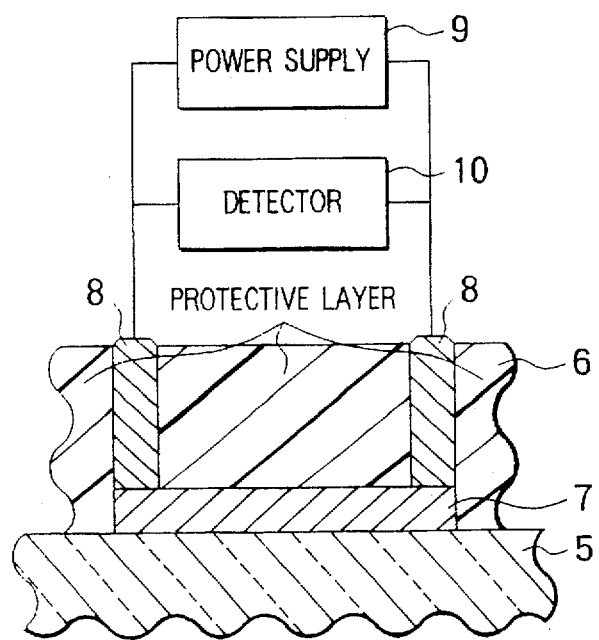
FIG. 2 is a schematic view showing elements of a preferred embodiment of the magnetoelectric transducer of the present invention.

An electroconductive portion 8 of the type shown in FIG. 2 is provided to this magnetoelectric transducer, and a circuit is formed between a power supply portion 9 and a detector 10. When current flows in this magnetoelectric transducer, change in the electrical resistance caused by the rotation of the magnetization of the first magnetic layer 1 due to a magnetic field which is formed perpendicular to the axis of easy magnetization of the first magnetic layer 1 is detected as a function of the detected magnetic field.

Figure 3:
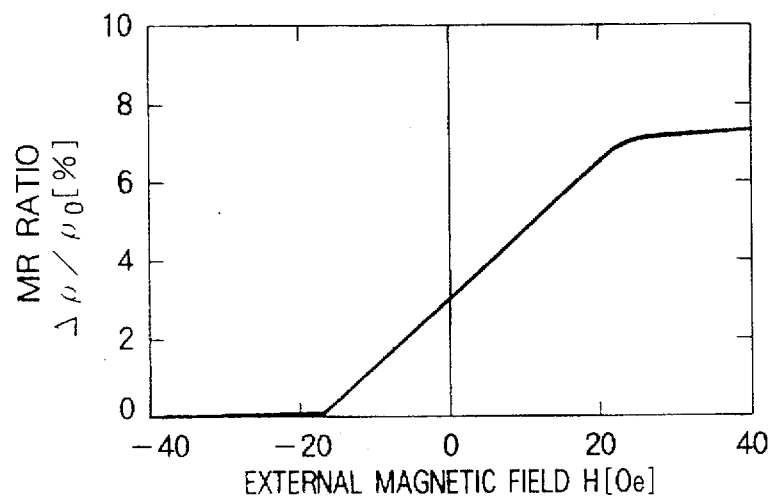
FIG. 3 is a view showing the MR sensitivity at room temperature for a preferred embodiment of the magnetoelectric transducer of the present invention.

FIG. 3 shows the GMR sensitivity of the magnetoelectric transducer according to this embodiment. The measurements were taken at room temperature. In the magnetic intensity range of from 0 to about 20 Oe, an extremely linear sensitivity characteristic was obtained. As for the relative change of the resistance (the MR ratio), $$(\rho-\rho_0)/\rho_0 \times 100 = 7.2\ [\%]$$

where $\rho_0$ is the resistance value when the magnetization of the first magnetic layer 1 and of the second magnetic layer 2 are parallel, and $\rho$ is the resistance value when they are antiparallel.

Figure 4:
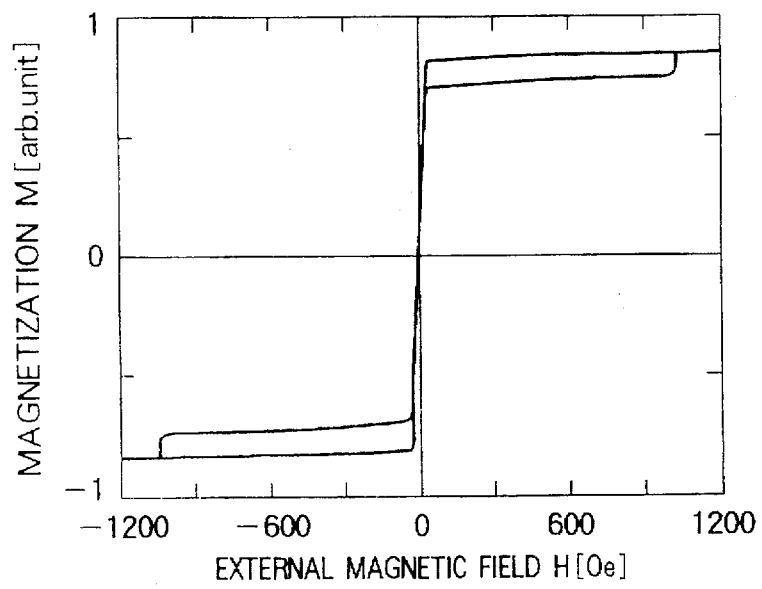
FIG. 4 is a view showing the magnetization curve at room temperature for a preferred embodiment of the magnetoelectric transducer of the present invention.

The magnetization curve of the magnetoelectric transducer of this first preferred embodiment as measured using a vibration sampling magnetometer (VSM) is shown in FIG. 4. The measurements were performed with the applied magnetic field being perpendicular to the axis of easy magnetization of the first magnetic layer 1, i.e., being applied in the direction of the axis of easy magnetization of the second magnetic layer 2. The measurements were taken at room temperature. The magnetization of the second magnetic layer 2 operates in the same as the magnetization of the rare earth—transition metal alloy layer 4, and they apparently behave as one layer. Although at room temperature the composition of the TbCo layer of this embodiment has rare earth dominance, taken with the adjacent Co layer as a whole transition metal dominance behavior is exhibited, and the switching field of the magnetization is about 1 kOe. This switching field is extremely large, such a large switching field can not be realized by using a prior art spin valve.

Figure 5:
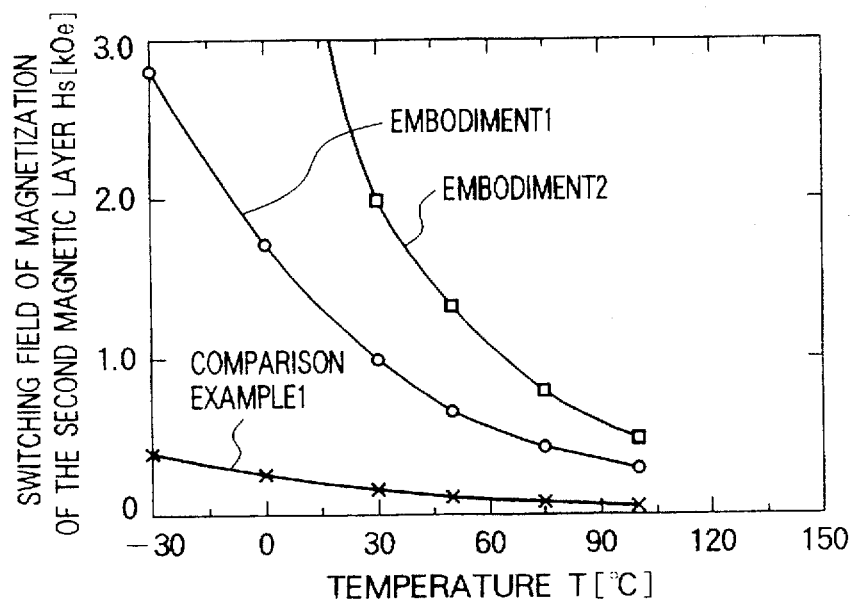
FIG. 5 is a view for explanation of the dependence upon temperature of the switching field of the magnetization, for varying cases for the composition of the rare earth—transition metal alloy layer which is comprised in the magnetoelectric transducer of the present invention.

The stability characteristic for temperature of the magnetoelectric transducer of this first preferred embodiment is shown in FIG. 5. The switching field of the magnetization of the second magnetic layer 2 becomes smaller as the temperature rises. However, even at 100° C. it is stable as far as 300 Oe, and is improved in comparison with a transducer element which uses a prior art spin valve layer.

EMBODIMENT 2

In FIG. 5 there is also shown an example of the stability characteristic for temperature of a transducer element in which the composition of the rare earth—transition metal alloy layer 4 is different from that of the magnetoelectric transducer constructed as in the above described embodiment. At room temperature the switching field of the magnetization of the second magnetic layer 2 is 2 kOe; and further, over the entire temperature range for which measurements were taken, the stability is improved as compared with the magnetic field in the magnetoelectric transducer of the first preferred embodiment.

The magnetoelectric transducer of this embodiment, like that of the first preferred embodiment, is formed upon a substrate 5 formed of glass, and is a layered structure comprising in order: a first magnetic layer 1 formed of $Ni_{80}Fe_{20}$ and having a thickness of 7.0 nm; a non magnetic layer 3 forme of Cu and having a thickness of 2.0 nm; a second magnetic layer 2 formed of Co and having a thickness of 3.0 nm; and a rare earth—transition metal alloy layer 4 formed of $Tb_{31}Co_{69}$ and having a thickness of 7.0 nm. Over the top of these a protective layer 6 is provided which is formed of SiN and the like and has a thickness of about 100 nm.

A comparison of the composition of the rare earth—transition metal alloy layer for the magnetoelectric transducers in the case of rare earth dominance and in the case of transition metal dominance will be explained with reference to FIG. 5 by taking as an example the stability of the switching field of the magnetization of the second magnetic layer 2 at room temperature.

Referring to FIG. 5, assuming a comparison example which has transition metal dominance, at room temperature the switching field of the magnetization of the second magnetic layer 2 for the comparison example is 120 Oe, and further, over the entire temperature range for which measurements were taken, the stability is worse, as compared with the that (=the stability) in the magnetoelectric transducer of the two above described preferred embodiments.

The magnetoelectric transducer of the comparison example is formed upon a substrate of glass and the like, and is a layered structure comprising in order: a first magnetic layer 1 formed of $Ni_{80}Fe_{20}$ and having a thickness of about 7.0 nm; a non magnetic layer 3 formed of Cu and having a thickness of about 2.0 nm; a second magnetic layer 2 formed of Co and having a thickness of about 3.0 nm; and a rare earth—transition metal alloy layer 4 formed of $Tb_{21}Co_{79}$ and having a thickness of 7.0 nm. Over the top of these a protective layer 6 is provided which is formed of SiN and like and has a thickness of about 100 nm.

In the magnetoelectric transducer of the comparison example, since the magnetic anisotropy in the direction perpendicular to the surface of the rare earth—transition metal alloy layer 4 (the perpendicular anisotropy) predominates over the magnetic anisotropy in the direction parallel to the surface of this layer (the anisotropy along the surface), perpendicular anisotropy of this layer is engendered in this and also in the second magnetic layer 2 which undergoes exchange coupling. For this reason, the MR curve exhibits complicated behavior, and a high GMR effect is not obtained.

Accordingly, as shown in FIG. 5, when at room temperature the composition of the rare earth—transition metal alloy layer 4 has rare earth dominance, the trend is to attain the objective of the present invention.

Since in the present invention the rare earth—transition metal alloy layer 4 undergoes exchange coupling with the magnetic layer of transition metal which is provided adjacent thereto, therefore these layers behave for a magnetic field as though they were a single layer. Accordingly, the composition is determined as though the rare earth—transition metal alloy layer 4 and this adjacent magnetic layer of transition metal taken together were composed as a single layer. Not only the composition of the rare earth—transition metal alloy layer 4, but also the thicknesses of the rare earth—transition metal alloy layer 4 and of the adjacent magnetic layer as well are available as parameters for adjustment of the composition.

On the other hand, the thicknesses of the rare earth—transition metal alloy layer 4 and of the adjacent magnetic layer are related to the magnetic anisotropy. Increase in the thickness of the rare earth—transition metal alloy layer 4 is effective for improvement of the stability, but along with increase in this thickness the perpendicular anisotropy tends to predominate over the anisotropy along the surface. If the rare earth—transition metal alloy layer 4 undesirably is a perpendicularly magnetized layer, perpendicular anisotropy is given rise to in the second magnetic layer 2 which undergoes exchange coupling therewith as well, and the GMR effect is extremely diminished.

For this reason it is very important to increase the magnetic anisotropy along the surface of the layer, and as one means for doing so a method of forming the layer in a situation in which a suitable magnitude of bias voltage is applied in the direction parallel to the surface of the layer is effective, as by a method of layer formation like the sputtering method.

EMBODIMENT 3

Figure 6:
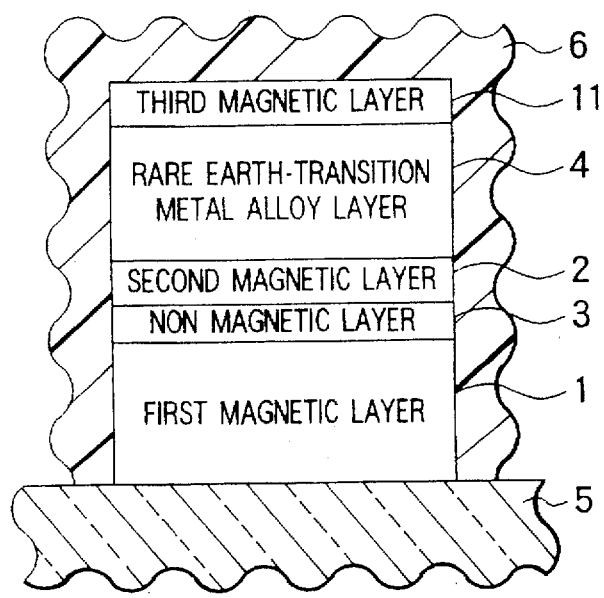
FIG. 6 is a sectional figure showing the spin valve layer of another preferred embodiment of the magnetoelectric transducer of the present invention.

An example of another effective method is shown in the following. A cross sectional view of this preferred embodiment is shown in FIG. 6.

In the construction of the magnetoelectric transducer element of this third preferred embodiment, which differs from that of the two preferred embodiments described above, a third magnetic layer 11 is newly provided adjacent to the rare earth—transition metal alloy layer 4. Upon a substrate 5 made of Si there is formed a layered structure comprising in order: a first magnetic layer 1 formed of $Co_{90}Fe_{10}$ and having a thickness of about 7.0 nm; a non magnetic layer 3 formed of Cu and having a thickness of about 2.0 nm; a second magnetic layer 2 formed of $Co_{90}Fe_{10}$ and having a thickness of about 2.5 nm; a rare earth—transition metal alloy layer 4 and formed of $Tb_{33}(Co_{90}Fe_{10})_{67}$ and having a thickness of about 10.0 nm; and then again a third magnetic layer 11 formed of $Co_{90}Fe_{10}$ and having a thickness of about 2.0 nm. Over the top of these a protective layer 6 is provided which is formed of SiN and the like and has a thickness of about 100 nm.

Figure 7A:
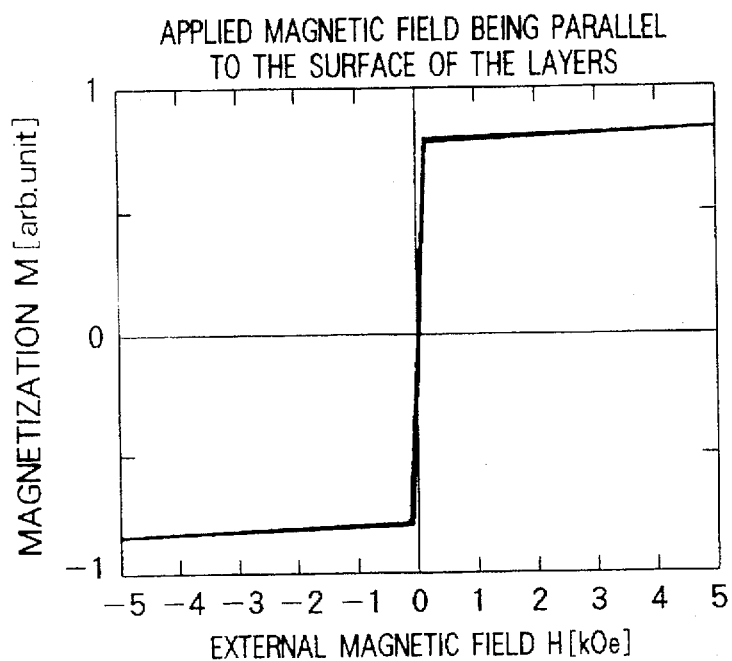
FIG. 7 is a view showing the magnetization curve at room temperature for another preferred embodiment of the magnetoelectric transducer of the present invention.
Figure 7B:
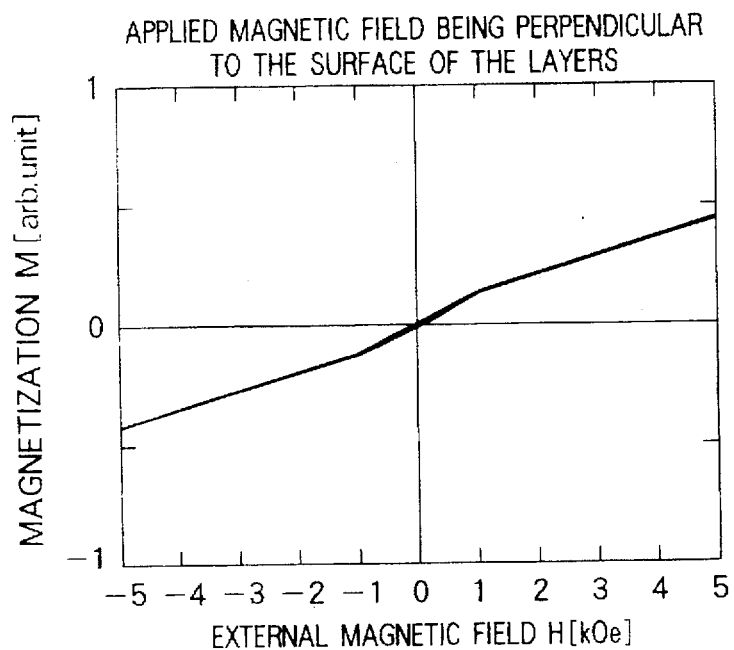

The magnetization curve of the magnetoelectric transducer of this third preferred embodiment as measured using a vibration sampling magnetometer (VSM) is shown in FIG. 7. The measurements for (a) were performed with the applied magnetic field being parallel to the surface of the layers, and for (b) with the applied magnetic field being perpendicular to the surface of the layers. The measurements were taken at room temperature. In comparison with the two preferred embodiments described above, the magnetic anisotropy along the surface of the layer predominates, although the thickness of the rare earth—transition metal alloy layer has been increased, which shows that the third magnetic layer 11 is effective for promoting this surface anisotropy along the surface.

Figure 8:
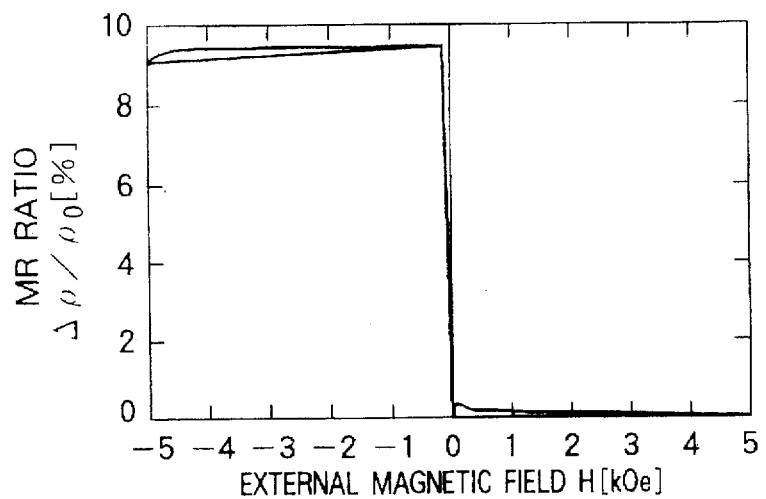
FIG. 8 is a view showing the MR curve at room temperature for another preferred embodiment of the magnetoelectric transducer of the present invention.

FIG. 8 exhibits the MR curve of the magnetoelectric transducer of this third preferred embodiment. The measurements were performed with the applied magnetic field being perpendicular to the axis of easy magnetization of the first magnetic layer 1, i.e., being applied in the direction of the axis of easy magnetization of the second magnetic layer 2. These magnetic anisotropies were induced in the same manner as in the first preferred embodiment. The measurements were taken at room temperature. Although at room temperature the composition of the TbFeCo layer of this embodiment has rare earth dominance, taken together with the two adjacent CoFe layers on either side as a whole, the combination has a compensated composition, and the diamagnetic field magnetization is even greater than 5 kOe.

Figure 9:
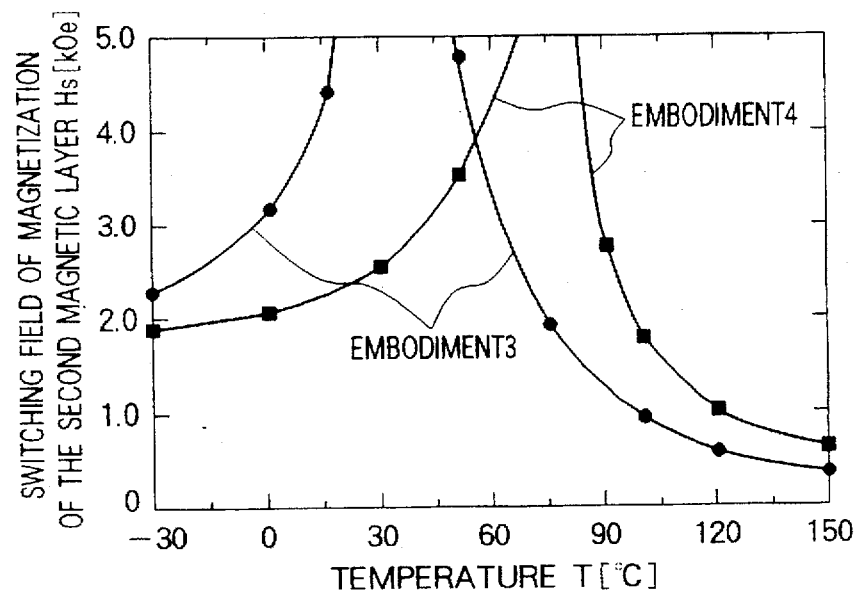
FIG. 9 is a view showing the stability for temperature for another two preferred embodiments of the magnetoelectric transducer of the present invention.

The stability characteristic for temperature of the magnetoelectric transducer of this third preferred embodiment is shown in FIG. 9. The switching field of the magnetization of the second magnetic layer 2 is large over quite a wide temperature range, suddenly diminishes in the neighborhood of 100° C., and is stable until 900 Oe.

EMBODIMENT 4

In the construction of the magnetoelectric transducer element of this fourth preferred embodiment, upon a substrate 5 made of Si there is formed a layered structure comprising in order: a first magnetic layer 1 formed of $Ni_{80}Fe_{20}$ and having a thickness of about 7.0 nm; a non magnetic layer 3 formed of Cu and having a thickness of about 2.0 nm; a second magnetic layer 2 formed of Co and having a thickness of about 2.5 nm; a rare earth—transition metal alloy layer 4 formed of $Tb_{33}Co_{67}$ and having a thickness of about 15.0 nm; and then again a third magnetic layer 11 formed of Co and having a thickness of about 2.0 nm. Over the top of these a protective layer 6 is provided which is formed of SiN and having a thickness of about 100 nm.

Figure 10:
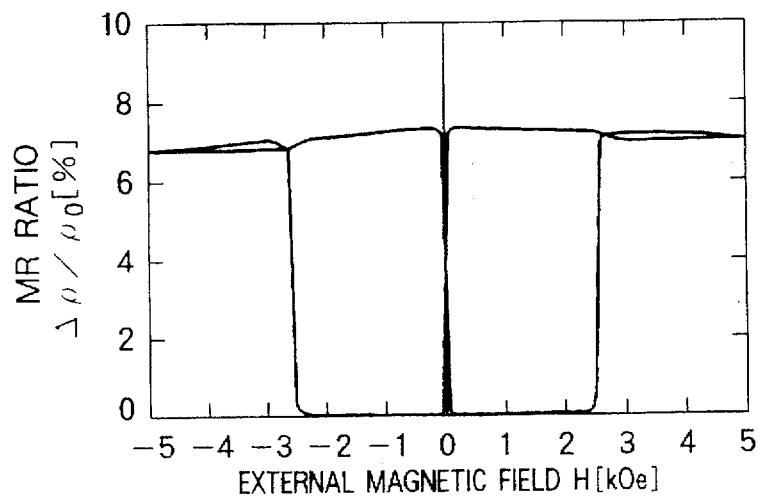
FIG. 10 is a view showing the MR curve at room temperature for yet another preferred embodiment of the magnetoelectric transducer of the present invention.

FIG. 10 exhibits the MR curve of the magnetoelectric transducer of this fourth preferred embodiment. The measurements were performed with the applied magnetic field being perpendicular to the axis of easy magnetization of the first magnetic layer 1, i.e., being applied in the direction of the axis of easy magnetization of the second magnetic layer 2. These magnetic anisotropies were induced in the same manner as in the first preferred embodiment. The measurements were taken at room temperature. The composition of the TbCo layer of this embodiment and the two adjacent Co layers on either side thereof taken together as a whole has rare earth dominance at room temperature, and possesses a characteristic MR curve.

The stability characteristic for temperature of the magnetoelectric transducer of this fourth preferred embodiment is also shown in FIG. 9. The composition of the TbCo layer and the two adjacent Co layers on either side thereof taken together as a whole has rare earth dominance at room temperature, and the temperature dependence of the switching field of the magnetization possesses a characteristic curve. The neighborhood of 70° C. is the compensation temperature, and the switching field of the magnetization is scattered. For this reason, the switching field of the magnetization is large over quite a wide temperature range, suddenly diminishes in the neighborhood of 100° C., and at 150° C. is stable until 500 Oe. In this manner, the stability of the magnetoelectric transducer in the high temperature region tends to be enhanced when the composition of the rare earth—transition metal alloy layer 4 has rare earth dominance at room temperature.

As described above, the rare earth—transition metal alloy layer 4 used in this fourth preferred embodiment undergoes exchange coupling with the second and third magnetic layers 2 and 11 which are provided adjacent to it, and taken together they behave as though they were a single layer. While possessing anisotropy along the surface, they exhibit the temperature dependence of the switching field identical to that of a per se known rare earth—transition metal alloy layer 4 which possesses perpendicular anisotropy as used in magneto-optical materials. In the prior art this type of characteristic had not been invented, and the stability of elements using a spin valve layer 7 had only been able to be guaranteed in very restricted environments; however, with the magnetoelectric transducer of this preferred embodiment, by adjusting the thickness of the second and third magnetic layers 2 and 11, and the composition and the thickness of the rare earth—transition metal alloy layer 4, the freedom of design for the stability of elements which use a spin valve layer has been enhanced.

EMBODIMENT 5

With the magnetoelectric transducer of this present invention, as the rare earth—transition metal alloy layer 4 there are used a TbFeCo alloys which have large magnetic anisotropy up to the high temperature region, which are effective upon the stability of the transducer element.

This magnetoelectric transducer is formed upon, for example, a substrate formed of glass and the like, and is a layered structure comprising in order: a 7.0 nm thick layer of $Co_{90}Fe_{10}$, which constitutes a first magnetic layer 1; a 2.0 nm thick layer of Cu, which constitutes a non magnetic layer 3; a 2.5 nm thick layer of $Co_{50}Fe_{50}$, which constitutes a second magnetic layer 2; a 12.0 nm thick layer of $Tb_{33}(Co_xFe_{100-x})_{67}$, which constitutes a rare earth—transition metal alloy layer 4; and then another 2.0 nm thick layer of $Co_{50}Fe_{50}$, which constitutes a third magnetic layer 11. Over the top of these a layer about 100 nm thick of SiN is provided, which constitutes a protective layer 6.

Figure 11:
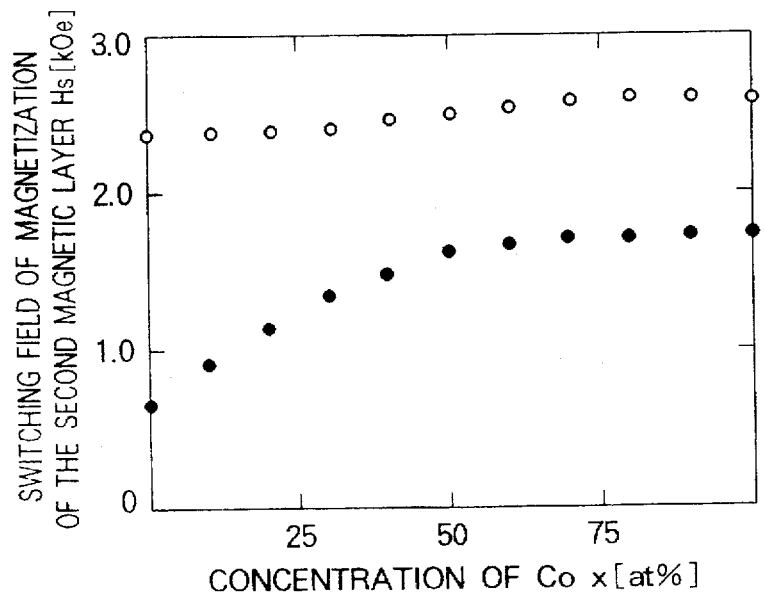
FIG. 11 is a view showing the relationship between stability and the Co concentration(of TbFeCo layer) for an embodiment of the magnetoelectric transducer of the present invention which uses a TbFeCo layer as the rare earth—transition metal alloy layer.

FIG. 11 shows the relationship between the stability of this fifth preferred embodiment magnetoelectric transducer and the proportion of Co in the layer of $Tb_{33}(Co_xFe_{100-x})_{67}$. The switching field of the magnetization of the second magnetic layer 2 are compared at room temperature and at 100° C.; alloy layers which satisfy $x \geq 50$ (atomic percent) have large switching field of the magnetization at 100° C., and accordingly are desirable.

EMBODIMENT 6

Since the magnetoelectric transducers of this present invention have high stability for temperature, these applicabilities in high environmental temperatures are widened, but in these circumstances thermal stability between the layers also becomes a very important feature. Using Cu for the non magnetic layer is necessary in order to obtain a high GMR effect, but for thermal stability it is effective to add some special element.

The magnetoelectric transducer of this sixth preferred embodiment is formed upon, for example, a substrate 5 of glass and the like, and is a layered structure comprising in order: a first magnetic layer 1 formed of $Ni_{80}Fe_{20}$ and having a thickness of about 7.0 nm; a non magnetic layer 3 formed of CuAg and having a thickness of about 2.0 nm; a second magnetic layer 2 formed of $Ni_{80}Fe_{20}$ and having a thickness of about 3.0 nm; a rare earth—transition metal alloy layer 4 formed of $Tb_{33}(Co_{90}Fe_{10})_{67}$ and having a thickness of about 15.0 nm; and then again a third magnetic layer 11 formed of $Ni_{80}Fe_{20}$ and having a thickness of about 2.0 nm. Over the top of these a protective layer is provided which is formed of SiN and has a thickness of about 100 nm.

EMBODIMENT 7

Because the magnetoelectric transducers of this present invention have a relatively hard second magnetic layer 2 which have high stability for magnetic fields and temperature, the freedom for choice of the first magnetic layer 1 is increased. For example, it is also permitted to select the material for the first magnetic layer 1 to be not particularly soft, in which case the selection of a material which has a higher GMR effect becomes possible.

Accordingly, the combination of magnetic layer/non magnetic layer is very important for a high GMR effect. If the main component of the non magnetic layer 3 is Cu, use of a $Fe_{1-x}Co_x$ layers for the magnetic layer give large resistance change. The desirable range for X is from 0.5 to 1 (including 0.5 and 1).

The magnetoelectric transducers of this seventh preferred embodiment is formed upon, for example, a substrate 5 formed of glass and the like, and is a layered structure comprising in order: a first magnetic layer 1 formed of Co and having a thickness of about 7.0 nm; a non magnetic layer 3 formed of Cu and having a thickness of about 2.0 nm; a second magnetic layer 2 formed of Co and having a thickness of about 3.0 nm; a rare earth—transition metal alloy layer 4 formed of $Tb_{33}Co_{67}$ and having a thickness of about 15.0 nm; and then a third magnetic layer 11 formed of Co and having a thickness of about 2.0 nm. Over the top of these a protective layer is provided which is formed of SiN and has a thickness of about 100 nm.

Figure 12:
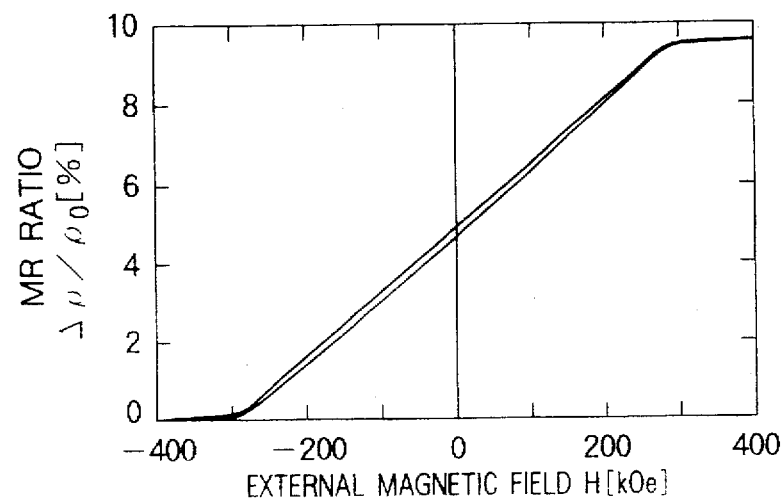
FIG. 12 is a view showing the MR sensitivity at room temperature for yet another preferred embodiment of the magnetoelectric transducer of the present invention in which a high GMR effect is realized.

FIG. 12 shows the GMR sensitivity of the magnetoelectric transducer according to this seventh preferred embodiment. The measurements were performed with the applied magnetic field being perpendicular to the axis of easy magnetization of the first magnetic layer 1, i.e., being applied in the direction of the axis of easy magnetization of the second magnetic layer 2. These magnetic anisotropies are induced by, for the first magnetic layer 1, slanting the substrate when forming the layer, i.e. by so called inclined vapor deposition, and, for the second magnetic layer 2, the third magnetic layer 11, and the rare earth—transition metal alloy layer 4, by heat treatment in a magnetic field after they have been formed. Herein, oblique-incident vapor deposition is only applied when forming the first magnetic layer 1. The measurements were taken at room temperature. Although the Co layer exhibits some hysteresis, a relatively linear sensitivity characteristic is obtained in the range of from 0 to about 300 Oe. The relative change of resistance is increased to about 9.2%.

It is necessary to select the first and second magnetic layers 1 and 2 in order to obtain a large GMR effect. Moreover, for the first magnetic layer 1 it is necessary take account of the desirability of linearity, and for the second magnetic layer 2 it is necessary to bear in mind the desirability of a large exchange coupling with the rare earth—transition metal alloy layer 4. Apart from Co, FeCo, and NiFe, also NiCo and NiFeCo are suitable, which are alloys of these and third transition metals of Ni and Fe. Furthermore, amorphous alloys in Fe system and Co system which are soft magnetic materials such as FeHfC, CoZrNb and the like are also suitable.

EMBODIMENT 8

Since the magnetoelectric transducer of this eighth preferred embodiment is an element which uses a spin valve layer, it is necessary for the exchange coupling between the first magnetic layer 1 and the second magnetic layer 2 to be small. The exchange coupling between the first magnetic layer 1 and the second magnetic layer 2 is increased according to the thickness of the non magnetic layer.

The magnetoelectric transducer of this eighth preferred embodiment is formed upon, for example, a substrate 5 of Si, and is a layered structure comprising in order: a first magnetic layer 1 formed of $Ni_{80}Fe_{20}$ and having a thickness of about 7.0 nm; a non magnetic layer 3 formed of Cu and having a thickness to ranging from 0 to 8.0 nm; a second magnetic layer 2 formed of Co and having a thickness of about 2.50 nm; a rare earth—transition metal alloy layer 4 formed of $Tb_{33}Co_{67}$ and having a thickness of 15.0 nm; and then a third magnetic layer 11 formed of Co and having a thickness of about 2.0 nm. Over the top of these a protective layer is provided which is formed of SiN and has a thickness of about 100 nm.

Figure 13:
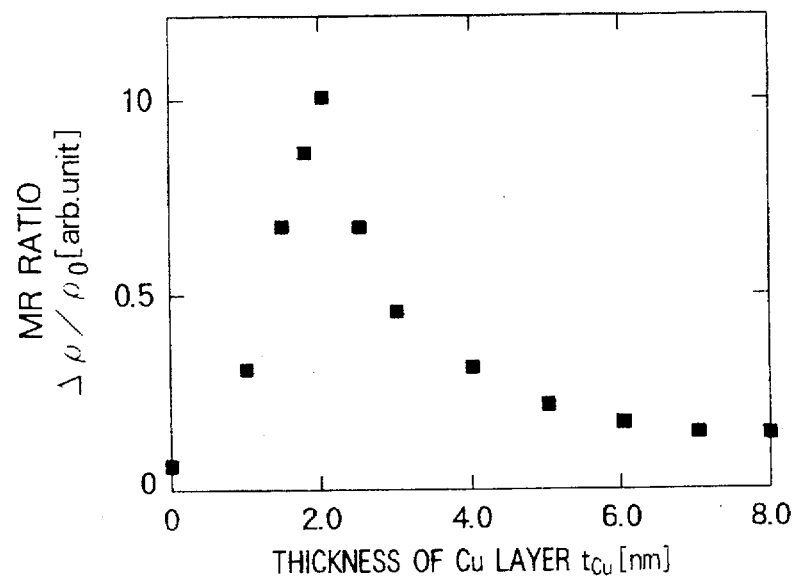
FIG. 13 is a view showing the relationship between the thickness of the non magnetic layer and the magnitude of the MR effect at room temperature, for the magnetoelectric transducer of the present invention.

FIG. 13 shows the dependence of the magnitude of the relative change of resistance for the thickness of the non magnetic layer 3. This is shown relatively, taking the value of the magnitude of the relative change of resistance when the non magnetic layer 3 is 2.0 nm thick as 1. If the non magnetic layer 3 is very thin, the above described exchange coupling attains its finite magnitude, and for this reason the relative change of resistance becomes small. The minimum thickness is 1.5 nm. Moreover, as the thickness of the non magnetic layer 3 becomes thicker, the relative change of resistance becomes smaller. The efficiency becomes bad when the non magnetic layer 3 is very thick, due to the effect of current distribution to the non magnetic layer 3 for the current flowing in the element, which is not desirable.

The magnetoelectric transducer of these preferred embodiments can be made by any method of thin layer formation, such as the sputtering method or the high vacuum vapor deposition method or the like. The control of the thickness of each layer may be performed by the opening and closing of a shutter which is time controlled. Furthermore, the magnetic anisotropy of the magnetic layers may be induced by, for example, applying a magnetic field along the surface of the layer while the layer is being formed, or by causing the vapor deposition particles to be induced upon the substrate at an oblique angle, or by heat treatment in a magnetic field after the layer has been formed. In particular, it is effective for the present invention to induce anisotropy upon the first magnetic layer 1 during its formation, and to confer anisotropy upon the second magnetic layer 2 and the rare earth—transition metal alloy layer 4 by heat treatment in a magnetic field after formation of this layer.

Since the rare earth—transition metal alloy layer 4 which is comprised in the magnetoelectric transducer of these preferred embodiments is an amorphous material, the fixing force for the magnetization of the second magnetic layer 2 does not receive much influence from the substrate or from any buffer-layer. For this reason, this transducer can be formed upon any substrate other than glass or Si. Moreover, it would also be possible to form this transducer upon the substrate by an opposite construction by ordered layer superposition from the rare earth—transition metal alloy layer 4, or from a third magnetic layer having sufficient thickness as necessary.

What is claimed is:

1. A magnetoelectric transducer comprising, formed upon a substrate, a first magnetic layer, a non magnetic layer, a second magnetic layer, and a rare earth—transition metal alloy layer;

said second magnetic layer and said rare earth—transition metal alloy layer undergoing exchange coupling;

said second magnetic layer and said rare earth—transition metal alloy layer having axes of easy magnetization, said axes being parallel to each other; and said rare earth—transition metal alloy layer having a composition exhibiting rare earth dominance at room temperature.

2. The magnetoelectric transducer of claim 1, wherein said non magnetic layer has a main component of Cu.

3. The magnetoelectric transducer of claim 1, wherein said non magnetic layer has a thickness of at least 1.5 nm.

4. The magnetoelectric transducer of claim 1, wherein said rare earth—transition metal alloy layer comprises a rare earth main component of Tb, and transition metal main components of Co and Fe.

5. The magnetoelectric transducer of claim 3, wherein said rare earth—transition metal alloy layer comprises $TbCo_xFe_{100-x}$, with $x \geq 50$ (atomic percent).

6. The magnetoelectric transducer of claim 1, further comprising a third magnetic layer being juxtaposed to said rare earth—transition metal alloy layer on a side opposite to said second magnetic layer.

7. The magnetoelectric transducer of claim 1, wherein said first magnetic layer and said second magnetic layer each having an axis of easy magnetization within the respective layer, said axes being mutually perpendicular, and being endowed with magnetic anisotropy.

8. The magnetoelectric transducer of claim 7, wherein said first magnetic layer is induced with magnetic anisotropy while it is being formed, while said second magnetic layer and said rare earth—transition metal alloy layer are endowed with magnetic anisotropy by heat treatment in a magnetic field after they have been formed.

* * * * *